United States Patent
Rezeanu

[19]

[11] Patent Number: 6,122,221
[45] Date of Patent: Sep. 19, 2000

[54] SCHEME FOR INCREASING ENABLE ACCESS SPEED IN A MEMORY DEVICE

[75] Inventor: Stefan-Cristian Rezeanu, Colorado Springs, Colo.

[73] Assignee: Cypress Semiconductor Corporation, San Jose, Calif.

[21] Appl. No.: 09/252,123

[22] Filed: Feb. 18, 1999

[51] Int. Cl.[7] ................................................. G11C 8/00
[52] U.S. Cl. .................. 365/233.5; 365/195; 365/230.05
[58] Field of Search .................................... 365/228, 229, 365/226, 203, 233.5, 195, 230.05

[56] References Cited

U.S. PATENT DOCUMENTS

| 5,471,432 | 11/1995 | Makihara | 365/233.5 |
| 5,493,537 | 2/1996 | McClure | 365/233.5 |
| 5,825,715 | 10/1998 | Rezeanu | 365/233.5 |

OTHER PUBLICATIONS

Hirofumi Shinohare et al., "A 45-ns 256K CMOS Static RAM with a Tri-Level Word Line", *IEEE Journal of Solid-State Circuits*, vol. SC-20, No. 5, pp. 929-934 (Oct. 1985).

Stephan T. Flannagan, et al., "Two 13-ns 64K CMOS SRAM's with Very Low Active Power and Improved Asynchronous Circuit Techniques", *IEEE Journal of Solid-State Circuits*, vol. SC-21, No.: 5, pp. 692-703 (Oct. 1985).

*Primary Examiner*—Tan T. Nguyen
*Attorney, Agent, or Firm*—Wagner, Murabito & Hao LLP

[57] ABSTRACT

In a memory device having a power-down mode, an address transition detection (ATD) signal within the memory device is inhibited at a power-up transition, provided that a power-down transition which proceeded the power-up transition ensured bit line equalization. The wordlines of the memory device may be disabled during the power-down mode and subsequently enabled (e.g., after an address-matched delay, to ensure a valid address is available for the first access following power-down) in response to the power-up transition. The ATD signal may be inhibited by generating a pulse having an appropriate starting time, and of sufficient duration to decouple an ATD pulse generator from dynamic bit line equalization control circuitry within the memory device. Such a pulse may be generated by combining a pair of signals produced in response to the power-up transition, at least one of the signals being delayed in time with respect to the other. In some cases, the ATD signal may be prevented by latching an address at the memory device, following an indication that the memory device is about to enter the power-down mode.

27 Claims, 16 Drawing Sheets

SCHEME FOR INCREASING ENABLE ACCESS SPEED IN A MEMORY DEVICE

FIELD OF THE INVENTION

The present invention relates to memory devices and, in particular, those memory devices which have a power-down mode, and relates to methods and apparatus for inhibiting and/or preventing address transition detection signals from causing potential access time push-outs within such devices at a power-up transition from such a mode.

BACKGROUND

Memory devices that include so-called power-down modes have been developed in an attempt to reduce the amount of current drawn by the device when not actively being used. An example of such a memory device 10 is shown is FIG. 1. Memory device 10 includes a data input path in which data signals 12 received at input pins of the device are conditioned (e.g., converted to appropriate internal levels, usually CMOS) in data buffers 14. In response to internal write signals 16 (which may be generated in response to appropriate external control signals), the data signals arc driven, using bus drivers 18, onto selected bit lines 20a and 20b. The bits lines 20a and 20b are associated with a particular column of memory cells 22, the column corresponding to the particular bit line pair being driven. When memory device 10 is not being actively written to or read from, the bit lines are equalized through the use of static and/or dynamic bit line pull up circuits 24, as is well known in the art. The read path circuitry of memory device 10 is not shown in detail, however, it may include conventional elements such as sense amplifiers and appropriate interface circuitry to provide signals from the memory cells to the output pins of the device.

Also shown in FIG. 1 is a portion of the address path circuitry for memory device 10. Address signals 26 are conditioned in associated address input buffers 28. The address signals may be provided to appropriate decoding circuitry, such as the row predecoders 30, in order to access selected rows (wordlines) of memory device 10. Further details regarding the row decoding circuitry is not shown in order not to obscure the diagram.

In addition to driving the word-line decoding circuitry, signals from the address input buffers 28 are provided to individual address transition detection (ATD) signal generators 32 to produce individual ATD signals 34. The individual ATD signals 34 provide an indication that an address switching event has occurred at the input of the memory device. Such address switching events are generally associated with read and write operations, and the associated ATD pulses are often used in memory devices to perform functions such as bit line equalization. For example, prior to any read, bit lines of the memory device must be properly equalized so as not to provide initial false readings to the associated sense amplifiers. The individual ATD signals 34 may be combined at an ATD combination stage 36 to produce a global ATD signal 38 which may be used for such functions. The ATD signal 38, together with appropriate block decoding and write detect signals 40 and 42, respectively, may be provided to the control circuitry 44 to control the dynamic bitline pullups, to enable/disable the sense amplifiers, as appropriate, and/or to allow write access to the bit lines from the data write bus drivers 18. Further details regarding such circuitry may be found in U.S. Pat. No. 5,825,715, incorporated herein by reference.

In addition to using the individual ATD signals 34, the ATD combination block 36 relies on a signal provided by a chip enable input buffer 46 of memory device 10. Chip enable input buffer 46 receives a chip enable (e.g., $\overline{CE}$, active low) signal 48, which is typically provided to an input pin of the memory device 10. In response, input buffer 46 provides an output signal 50, which may be delayed by an appropriate period ($\tau_2$) through a delay block 52 before being passed to the ATD combination block 36. In this way appropriate timing for the global ATD signal 38 may be provided, simultaneously with its activation during standby, usually for bitline equalization purposes.

Chip enable input buffer 46 also provides a fast power-up signal 54 to thc address input buffers 28. This fast power-up signal 54 is used to indicate that the memory device 10 is about to enter a power-down mode, in which the outputs of the address input buffers 28 are brought to a predetermined logic state, or is powering-up from such a power-down mode. In some cases, the fast power-up signal 54 may also be provided to the row predecoders 30, for example through an appropriate delay ($\tau_1$) 56.

In operation, when memory device 10 is placed in a power-down mode, indicated by the memory device being deselected (i.e., $\overline{CE}$ at a high logic level), the address input buffers 28 are forced to a predetermined state so that in case the address is changed externally (e.g., as may be the case where a different memory device is selected). the input buffers do not toggle, and thus the power consumption is kept lower. When the address buffers are placed in such a state, a corresponding address (e.g., address 00 . . . 00) might be active within memory device 10. As a result, when the memory device is powered-up and a new address is selected, an ATD pulse will be generated.

The generation of such an ATD pulse presents a problem in that the normal device access time will be pushed out. For example, consider that a normal access time (Taa) is a function of the normal ATD pulse width. However, at power-up the ATD signal itself is not produced until the fast power-up signal 54 is received from the chip enable input buffer 46. In other words, the access time due to the chip enable function (Tace) is a function of the delay within the chip enable input buffer 46 plus the regular access time Taa. Thus, Tace becomes a limiting factor for the speed of memory device 10 and, generally, this not an acceptable condition.

Although others have recognized this access timing problem associated with memory devices that allow for power-down modes, the solutions that have been proposed to date are generally unacceptable. For example, Shinohara et al., proposed a chip select speed-up circuit that accelerated the trailing edge of an ATD signal within a memory device. See, Shinohara et al., A 45-ns 256 k CMOS Static RAM with a Tri-Level Wordline, IEEE Journal of Solid-State Circuits, vol. SC-20, No. 5, pp. 929–34, at 931 (October 1985). Although the acceleration of the trailing edge of the ATD signal may improve access time somewhat, it does not eliminate the problem posed by the Tace push-out. Indeed, because the solution proposed by Shinohara et al., does not eliminate the ATD signal generated at power-up, one can expect the Tace condition to always remain a limiting factor for memory devices incorporating such a solution.

A second solution that has been proposed by Flannagan et al., uses what appears to be rather complex circuitry in an effort to correlate various internal signals within the memory device. See Flannagan et al., IEEE Journal of Solid State Circuits Vol. SC-21, No. 5, pp. 692–703, at 697–98 (October 1986). In their design, Flannagan et al. proposed inhibiting the ATD signal which would be otherwise generated at power-up but failed to discuss any details regarding how this inhibiting function is performed. In addition, it appears that the solution proposed by Flannagan et al. may suffer from push-out penalties of its own if the first access after the stand-by mode is made to the same column of memory cells as was addressed by the predetermined power-down address, especially where data of the opposite logic state is to be read.

Moreover, given the logic circuitry shown by Flannagan et al. (see FIG. 10 at p. 697), it does not appear that an ATD signal will be inhibited only if a proper bit line equalization has been assured during the power-down state. To elaborate, consider that the Flannagan design uses separate ATD and chip enable signal paths that are ultimately combined in a summation OR-type gate. This design dictates that the block (no label is provided for this block) in the ATD signal path determines the duration of the ATD pulse. Also, the minimum duration of the stand-by equalization pulse cannot help but be determined by the block (again unlabeled) in the chip enable signal path. At the very least, such a design would make it difficult to assure proper bit line equalization during stand-by.

Accordingly, what is needed is a solution for the Tace condition described above that overcomes the failings of previously posed solutions therefor.

SUMMARY OF THE INVENTION

In one embodiment, a method that includes detecting a power-up transition at a memory device having a power-down mode and inhibiting, in response to the power-up transition, an address transition detection (ATD) signal within the memory device is provided. Importantly, in this embodiment the ATD signal is inhibited at power-up, but making sure a perfect bit line equalization took place during power-down within the memory device. In addition, the wordlines of the memory device may be disabled during the power-down mode and subsequently enabled (e.g., after a delay synchronized with the valid address delay) in response to the power-up transition. The ATD signal itself may be inhibited by generating a pulse of sufficient time duration to decouple one or more individual ATD pulse generators. As a result, the ATD combined pulse is prevented from activating the dynamic bit line equalization control circuitry within the memory device. Such a pulse may be generated by combining a pair of signals produced in response to the power-up transition, at least one of the signals being delayed in time with respect to the other. This combination may be accomplished by circuitry which provides a logical NOR operation.

In a further embodiment, a method that includes disabling, during a power-down mode, one or more wordlines of a memory device and, in response to a power-up transition, enabling the wordlines and inhibiting an ATD signal within the memory device is provided. As above, the wordlines may be enabled following a delay tracking the address path delay, in order to ensure that a valid address is available. Also, the ATD signal may be inhibited by decoupling one or more ATD signal generators from the dynamic bit line equalization control circuitry within the memory device. Such decoupling may include removing power from a logic gate within the ATD signal generator for a time sufficient to mask the ATD signal that would otherwise be generated. This may be accomplished, for example, by gating a transistor coupled between a power source and the logic gate.

In yet another embodiment, a method that includes preventing an ATD signal from being produced within a memory device at a power-up transition from a power-down mode by latching the addresses at the memory device following an indication that the memory device is about to enter the power-down mode is provided. Such latching may be performed in response to a power-down signal provided within the memory device; the power-down signal being provided after a delay sufficient to ensure a stable valid address will be available.

In still another embodiment, a memory device is provided and includes a first circuit configured to inhibit an ATD signal at a power-up transition from a power-down mode. The memory device may also include a second circuit configured to enable one or more wordlines of the memory device in response to the power-up transition. In some cases, the first circuit may be a pulse generator that is configured to combine a pair of signals produced in response to the power-up transition, one of the pair of signals being time delayed with respect to the other. Such a combination may be provided using a logical NOR gate within the pulse generator. The output of the NOR gate may be provided to a third circuit which is configured to decouple the ATD signal from bit line equalization circuitry within the memory device. Such a third circuit may include a logic gate coupled to receive an address signal and to produce an ATD signal in response thereto, the logic gate being decoupled from an associated power source by the output signal of the NOR gate. Such decoupling may be accomplished by gating a transistor coupled between the power source and the logic gate.

In other cases, the first circuit of the memory device may be an address buffer configured to store an address input thereto in response to an indication that the memory device is about to enter a power-down mode. Such an address buffer may include a level-triggered storage device coupled to receive a delayed version of the power-down signal. or an edge-triggered flip-flop coupled to receive such a signal.

Other features and advantages provided by the present invention will be described with reference to the accompanying drawings in the discussion below.

BRIEF DESCRIPTION OF THE DRAWINGS

The present invention is illustrated by way of example, and not limitation, in the figures of the accompanying drawings in which.

DETAILED DESCRIPTION

In a following discussion, an example of the present invention which utilizes an input-buffer-driven ATD-inhibit structure to prevent an extended access time at power-up is presented. Within the scheme, a wordline disable function may be incorporated so as to prevent an access to a predetermined power-down address. This avoids wordline glitches (e.g., through an address corresponding to a predetermined state stored during a power-down mode), which may otherwise be experienced at power-up. Additionally, alternative embodiments in which an address input buffer is used to store a true logic value of its input shortly after a memory device is switched into a power-down mode are discussed. Although such schemes represent examples of the present invention, they should not be viewed as limiting the broader spirit and scope thereof. For example, after reviewing the various schemes presented below, those of ordinary skill in the art will recognize that various modifications may be made thereto, without altering the fundamental ideas behind the present invention. Accordingly, the claims which follow this discussion should not be deemed as limited by the examples presented below.

Figure 1:
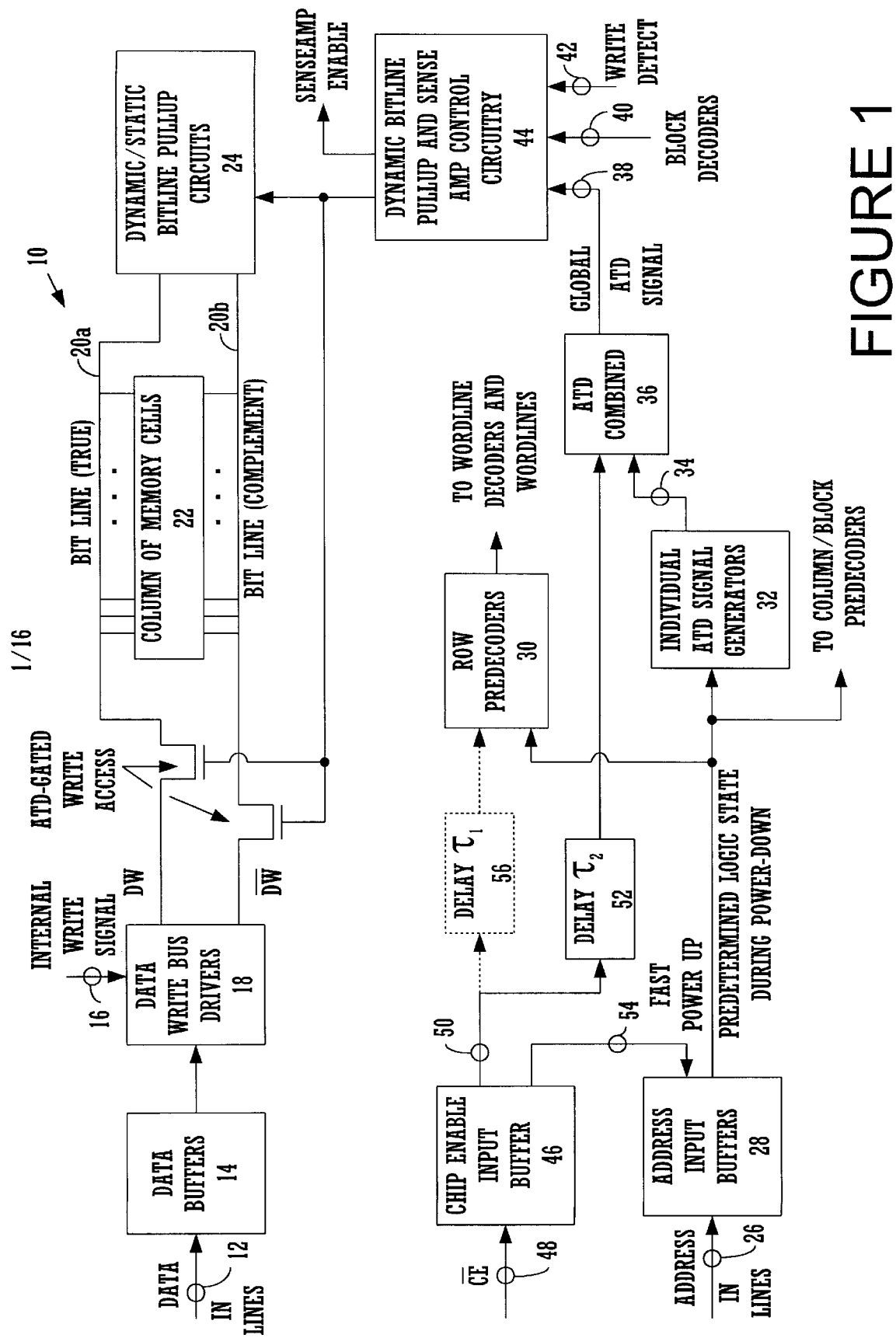
FIG. 1 illustrates a conventional memory device which may have an associated power-down mode when not actively selected.
Figure 2:
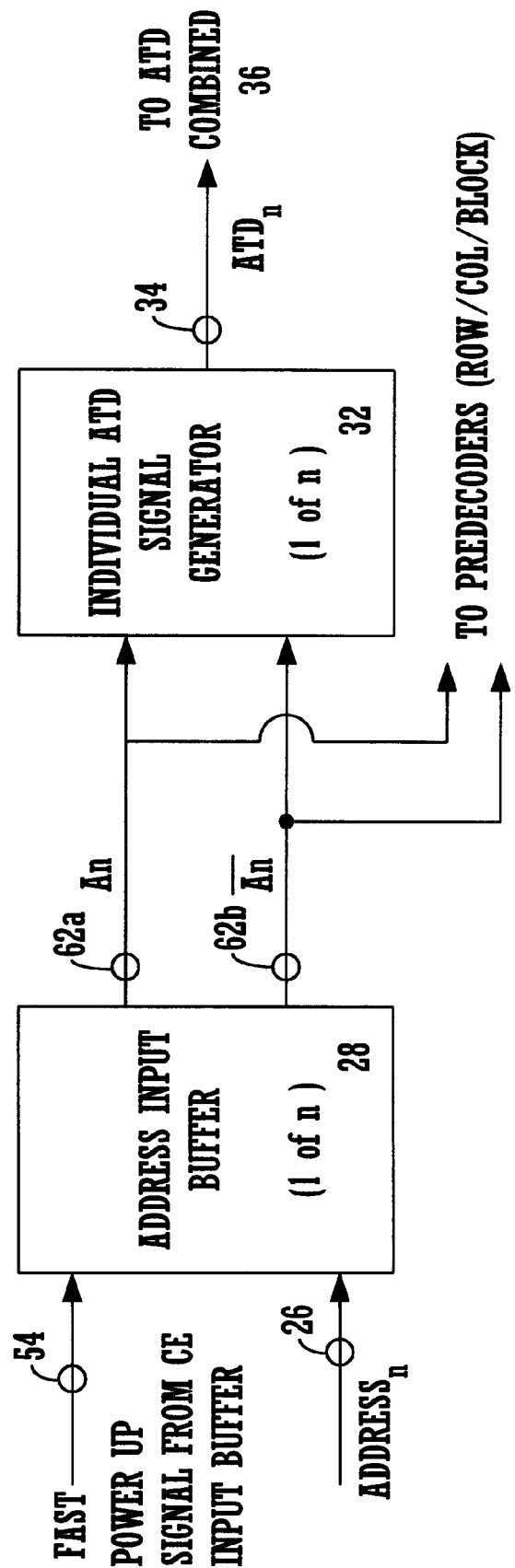
FIG. 2 illustrates a portion of the address input path for the memory device of FIG. 1.

As described above with reference to FIG. 1, in those memory devices which are capable of being placed in a stand-by or powered-down mode, the chip enable access time (Tace) may be extended beyond a normal access time (Taa) as a result of the combined effects of a delayed power-up (chip enable activated) signal provided to the address buffers, and a correspondingly delayed ATD pulse. In order to more fully appreciate the advantages offered by the present invention, some further details regarding the circuitry shown in FIG. 1 is appropriate. For example, FIG. 2 shows a portion of the address input path illustrated in FIG. 1. Address input path 60 includes a number of address input buffers 28. The number, n, of address input buffers 28 is determined by the number address lines 26 provided to the memory device 10. Address input buffer 28 also receives the fast power-up signal 54 from the chip enable input buffer 46. In response, address input buffer 28 provides address signals An and $\overline{An}$, 62a and 62b, respectively, which usually are delayed and level-conditioned, true and complement counterparts of the address input signal 26. These signals are provided to predecoding circuitry, including the wordline (row) pre-decoders 30 as described above, and to the input of an individual ATD signal generator 32. The individual ATD signal generator provides an ATD signal 34 to the ATD combined block 36, where n such signals are combined to produce the global ATD signal, as discussed above with reference to FIG. 1.

Figure 3:
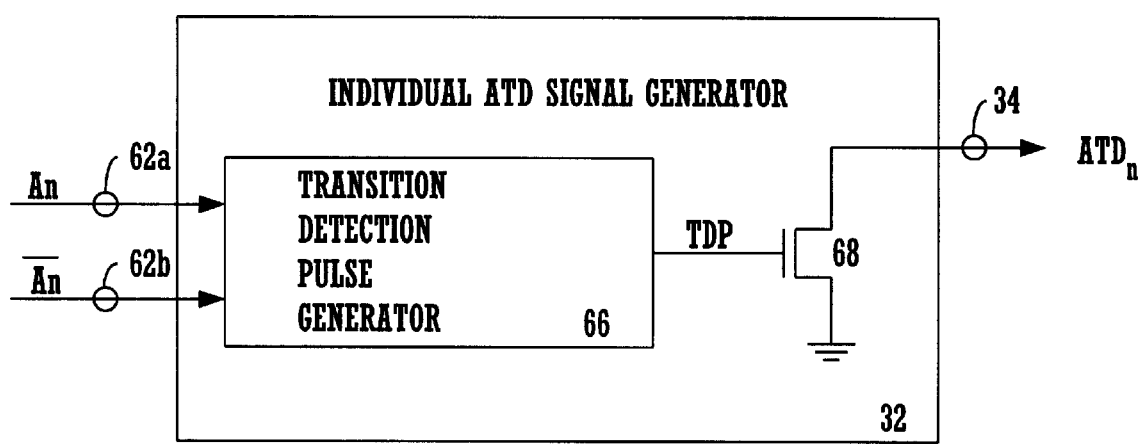
FIG. 3 illustrates an individual ATD signal generator within the address path of the memory device shown in FIG. 1.

FIG. 3 illustrates various details of the individual ATD signal generator 32 in greater detail. As shown, each individual ATD signal generator 32 is made up of a transition detection pulse (TDP) generator 66 and an associated pull-down transistor (e.g., an n-channel transistor) 68. For the complete memory device 10, n such individual ATD signal generators 32 will be present. In operation, TDP generator 66 uses the true and complement address signals 62a and 62b to produce output signal TDP, which gates pull-down transistor 68. Thus, when signal TDP is active (logic high) pull-down transistor 68 pulls the logic level of the individual ATD signal 34 low. Such a signal indicates an address transition on the address line 26 input to the corresponding address input buffer 28.

Figure 4:
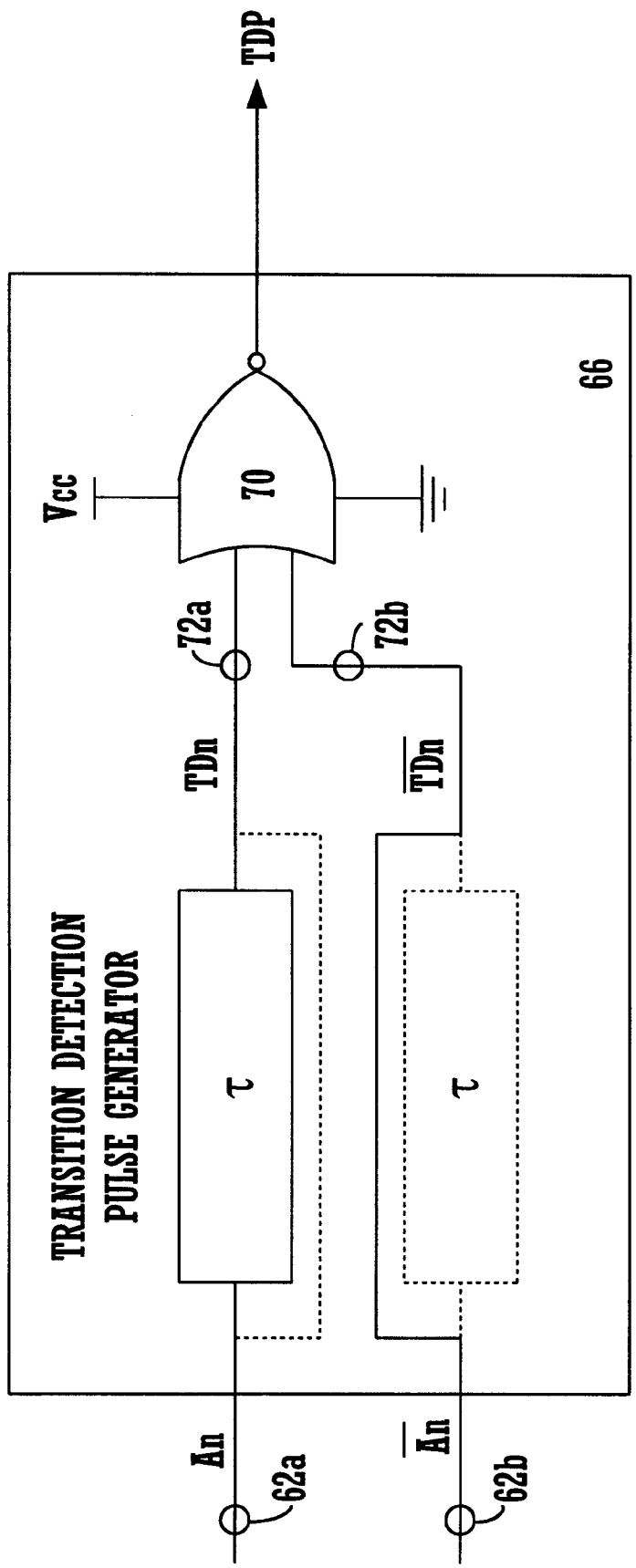
FIG. 4 illustrates a transition detection pulse generator for the individual ATD signal generator shown in FIG. 3.

As shown in FIG. 4, signal TDP is produced using a logic gate 70, which receives as inputs true and complement signals TDn and $\overline{TDn}$, 72a and 72b respectively. Signals TDn and $\overline{TDn}$ are the same signals as the address signals An and $\overline{An}$, 62a and 62b, respectively, with one of those signals having passed though a delay block τ so that it is delayed in time with respect to the other. Either of these address signals may be delayed with respect to the other according to whether the address input signal 26 is transitioning from logic high to logic low or logic low to logic high. Thus, the presence or absence of a particular delay block X in the signal path of either of these address signals 62a or 62b is shown though the use of dotted outlines. In one example, shown in FIG. 5, the signal TDn is delayed with respect to its logic complement $\overline{TDn}$. Thus, signal $\overline{TDn}$ has the same profile as the address input signal $\overline{An}$, and signal TDn has the same profile as address input signal An, but is delayed in time with respect to An by a time τ.

Figure 5:
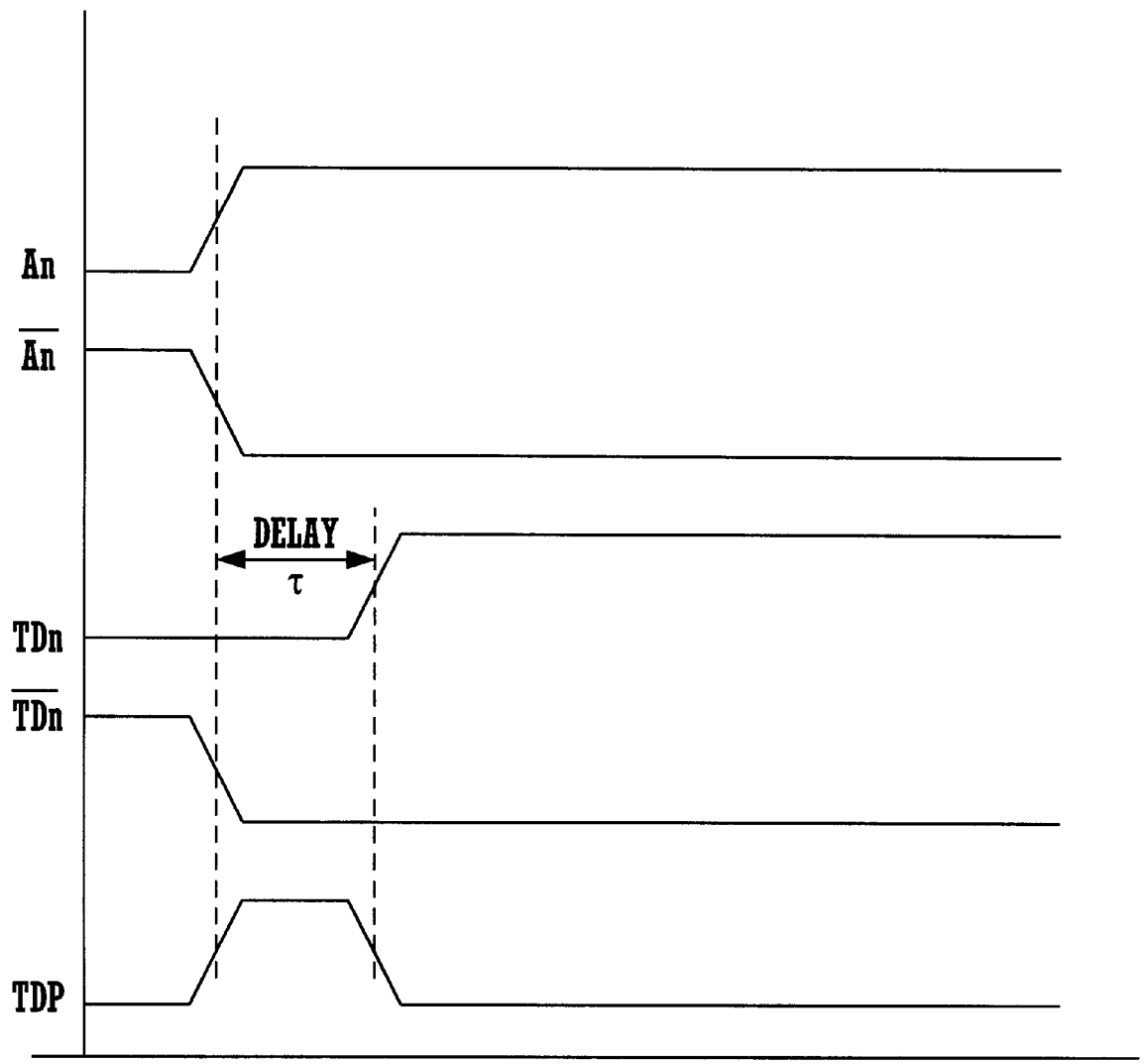
FIG. 5 is a timing diagram for the transition detection pulse generator shown in FIG. 4.

For the case where logic gate 70 is a NOR gate, signal TDP will be produced when both signals TDn and $\overline{TDn}$ are logic low, as shown in FIG. 5.

Notice also that logic gate 70 is powered from a power source, Vcc. Thus, when signal TDP is active, pull-down transistor 68 is turned on and the associated individual ATD 34 is produced. This individual ATD signal is provided to the ATD combined block 36 as shown in FIG. 1, thus contributing to the global ATD signal 38. As indicated above, global ATD signal 38 is provided to the dynamic bit line equalization control circuitry 44, which may act to equalize bit lines such as 20a and 20b prior to a read operation in memory device 10. During the bit line equalization, the bit lines might be made inaccessible to a write operation, cutting off the two n-channel pass gates shown in FIG. 1 between DW and $\overline{DW}$ and the bitlines. See, e.g., U.S. Pat. No. 5,825,715.

Figure 6:
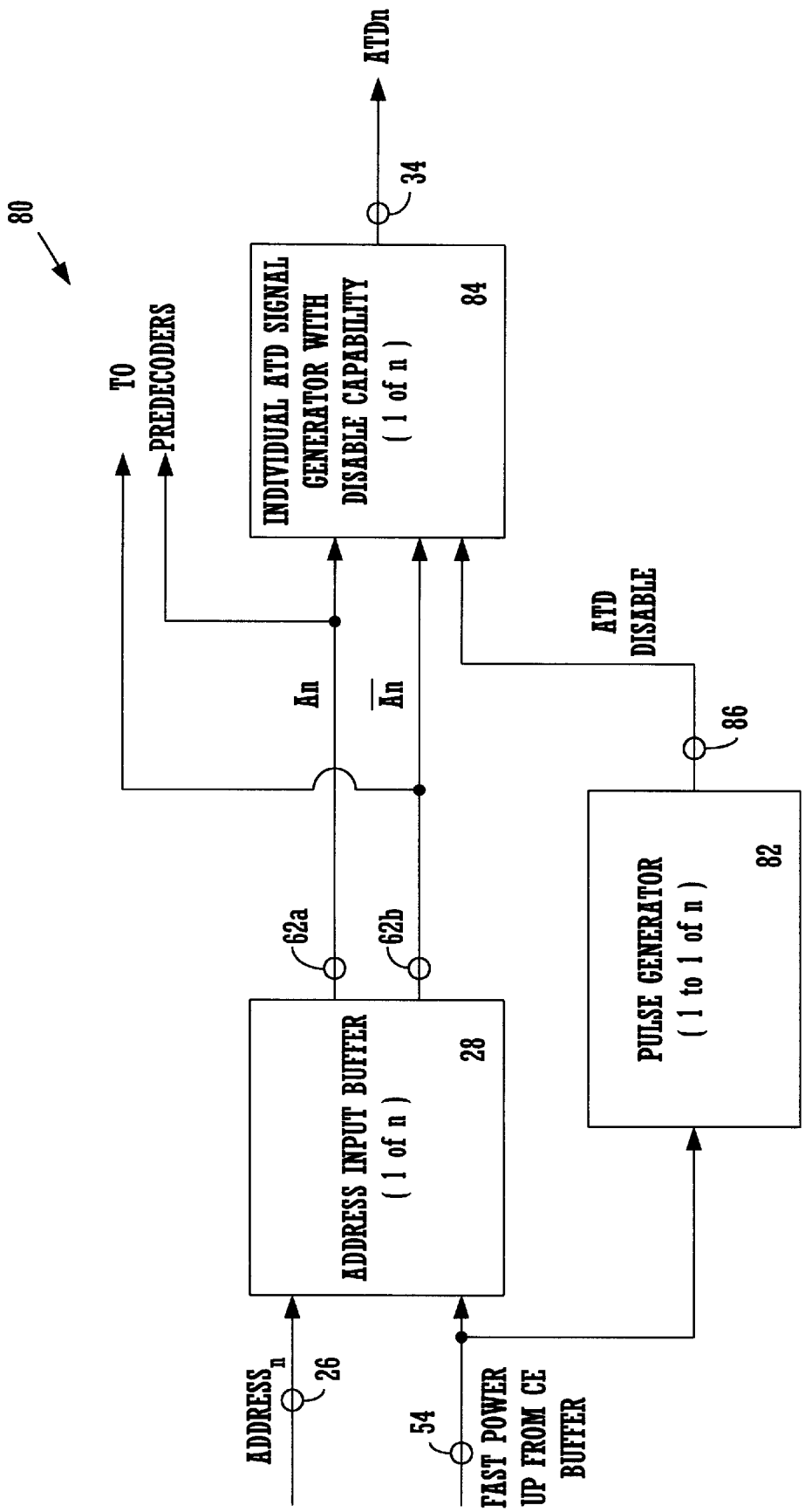
FIG. 6 illustrates a portion of the address input circuitry of a memory device configured in accordance with one embodiment of the present invention.

Now, to prevent an ATD signal which would otherwise be generated by the above described circuitry at a power-up transition (i.e., in response to switching from the standby predetermined state to the true value of the corresponding address input of the memory device 10), the circuitry shown in FIG. 6 is introduced in the address input path of memory device 10. This address input path with ATD disable capability 80 includes the familiar address input buffer 28, which receives address input signals 26 and the power-up signal 54 from chip enable input buffer 46. As before, the address input buffer provides the true and complement versions of the address signals An and $\overline{An}$, 62a and 62b, respectively, which may be provided to the predecoders. Unlike the above described address input path 60, however, this new address input path 80 includes a pulse generator 82 and individual ATD signal generator with disable capability 84. In one embodiment, each address input buffer 28 may have a corresponding pulse generator 82. while in other embodiments, a single pulse generator 82 may be associated with n address input buffers for memory device 10. Of course, in still other embodiments, a single pulse generator 82 may be included for each of m address input buffer 28, where there are a total of n/m groups of address input buffers 28 for the memory device 10.

Pulse generator 82 is triggered by the power-up signal 54 from the chip enable input buffer 46 to inhibit the potential individual address ATD pulse which might otherwise occur immediately after power-up of memory device 10. As discussed above. this individual address ATD signal may be produced as a result of the output of the address buffer 28 transitioning from the predetermined logic state, assumed during the power-down mode, to the true logic value of the corresponding input address. Without the use of pulse generator 82 (or equivalents thereof), or other schemes, as discussed below and contemplated within the scope of the present invention, such an address transition would otherwise occur even if the address itself was not changed while the memory device was in stand-by, merely because the logic value of the address may be opposite to the predetermined stand-by mode internal address value. As indicated, the number of pulse generators 82 used may be anywhere between 1 (for the entire memory device) up to the number of address inputs. The former case provides the advantage of a lower load for chip enable input buffer 46, while the latter tends to ensure a better delay match between the chip select path and address path of the memory device, for each individual address buffer 28. This delay matching of the address path tracks over changes in temperature, technologies, voltages, etc.

Figure 7:
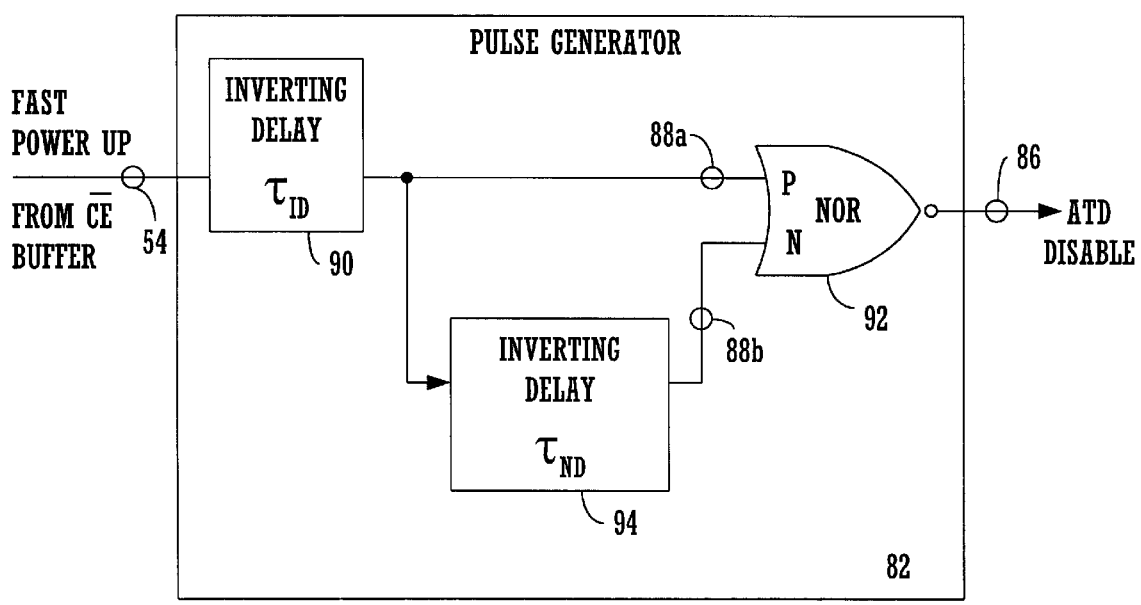
FIG. 7 illustrates a pulse generator for use in the address path circuitry of FIG. 6 in accordance with one embodiment of the present invention.
Figure 8:
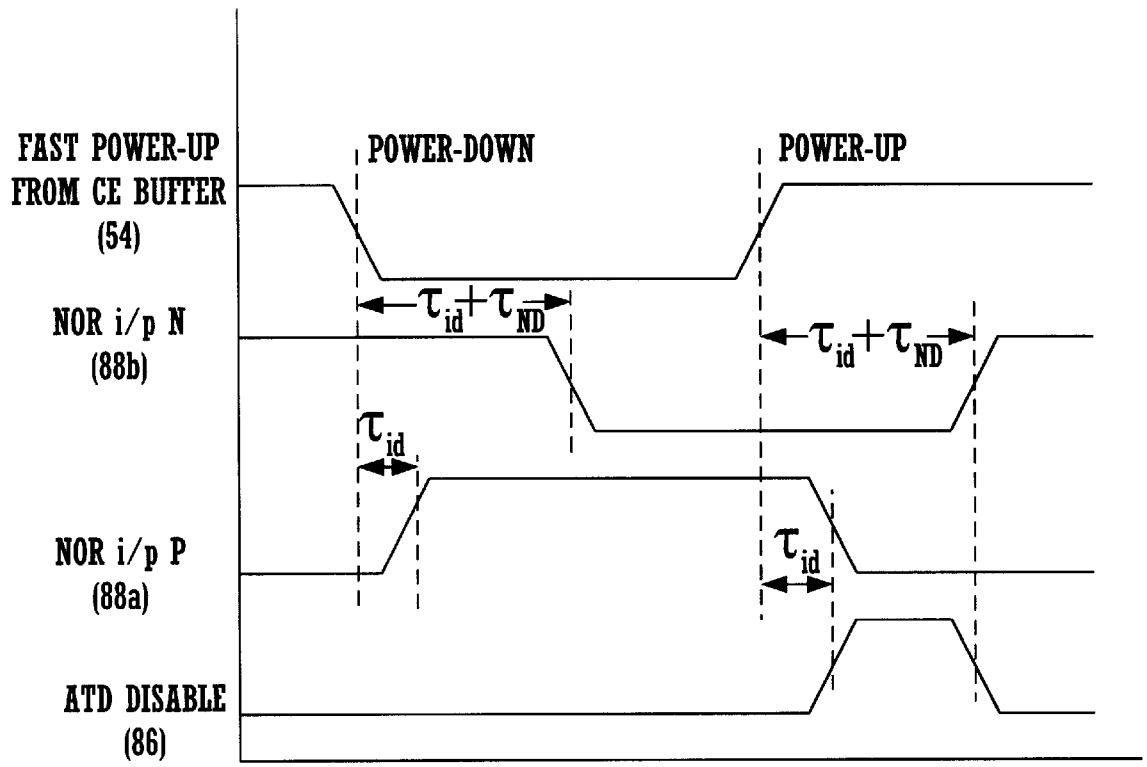
FIG. 8 is a timing diagram for the pulse generator shown in FIG. 7.

In operation, pulse generator 82 produces an ATD disable signal 86, which inhibits the production of the individual ATD signal 34. In one embodiment, ATD disable signal 86 is produced as a logical combination of a pair of signals as shown in FIG. 7. This pair of signals 88a and 88b are each developed from the power-up signal 54 provided by the chip enable input buffer 46. In this example, power-up signal 54 is provided to the input of an inverting delay 90, having an associated delay $\tau_{iD}$. The output of the inverting delay block 90 is provided to one input of a logic gate 92 (e.g., a NOR gate) as input signal 88a, and to the input of an inverting delay block 94 having an associated delay $\tau_{ND}$. The output of the inverting delay block 94 is the other input signal 88b to logic gate 92. Thus, as shown in FIG. 8, when the power-up signal 54 from the chip enable input buffer 46 transitions from a logic high to a logic low (e.g., signaling the beginning of a power-down mode for memory device 10), input signal 88a to logic gate 92 follows that transition after a delay $\tau_{iD}$ associated with the inverting delay block 90. Of course, because of the action of the inverting delay block 90. input signal 88a is the logic inverse of power-up signal 54. Likewise, input signal 88b will follow the logic transition of power-up signal 54, but in this case such a transition is delayed by the combined time of $\tau_{iD}$ and $\tau_{ND}$. The inverting delay block 94 may be implemented using an even number of logic inverters, and hence the logic state of input signal 88b will be the same as the logic state of power-up signal 54, as shown. Because of the logical NOR function provided by logic gate 92, there is no effect on the ATD disable signal 86 provided by the power-down transition. Thus, the regular activation of the global ATD signal may be expected as the chip enters the power-down mode. This takes place not only as a result of the address input buffers being forced to the power-down state, but mainly through the direct action of signal 50—which, in general, may be the same as the fast power-up signal 54—through the delay $\tau_2$ provided by block 52, on the ATD combined block 36 in FIG. 1. It is required that the ATD combined block 36 provides an at-least same duration global ATD signal 38 pulse as a regular address transition, in order to ensure that perfect equalization is provided throughout memory device 10 during the power-down mode.

At power-up, however, when power-up signal 54 transitions from logic low to logic high, a difference is noted. In this case, input signal 88a follows the power-up transition after a time $\tau_{iD}$ (the logic state of input signal 88a is opposite to that of power-up signal 54). Likewise, input signal 88b will follow the power-up transition after the time $\tau_{ND}+\tau_{iD}$ associated with blocks 90 and 94. Thus, as shown in FIG. 8, there is a period of time during which both input signals 88a and 88b to logic gate 92 are logic low. Because of the action of logic gate 92, this will mean that the ATD disable signal 86 will be a logic high pulse. This pulse is the ATD disable signal 86 that is provided to the individual ATD signal generator with disable capability 84 and will ensure that no additional ATD signal is provided at the power-up transition. Hence, the start time and width of the ATD disable pulse 86 may be adjusted by adjusting $\tau_{iD}$ and $\tau_{ND}$ to provide desired start time and pulse width, respectively. Note, because the bit lines of memory device 10 were equalized during the power-down mode, as described above, no additional ATD signal is needed at power-up to ensure this equalization. Indeed, as discussed above, any such ATD signal would merely extend the access time unnecessarily, resulting in Tace being greater than Taa.

Figure 9:
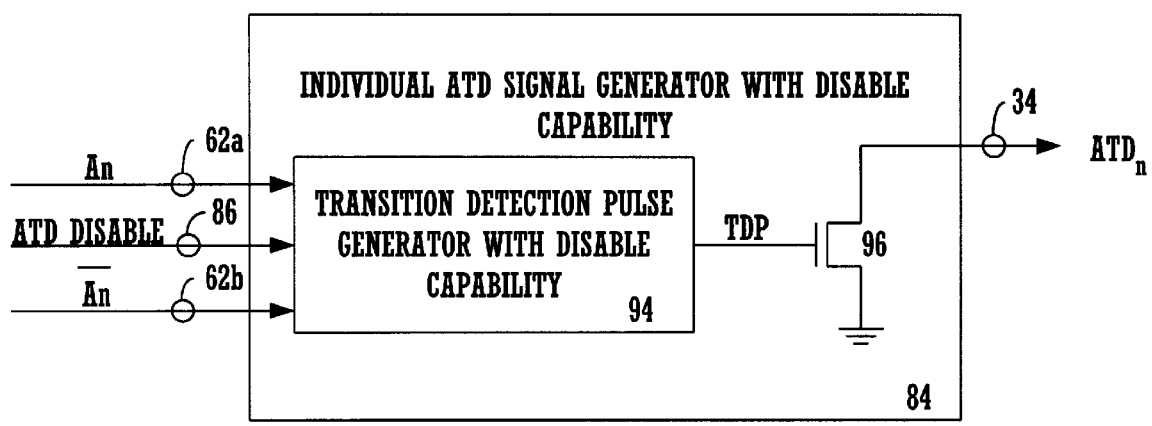
FIG. 9 illustrates an individual ATD signal generator with disable capability for use in the address path circuitry shown in FIG. 6, in accordance with an embodiment of the present invention.

FIG. 9 now shows the details of one example of the individual ATD signal generator with disable capability 84. Notice that the true and complement address signals An and $\overline{An}$, 62a and 62b, are provided to a transition detection pulse generator 94 as before. However, transition detection pulse generator 94 is also provided with the ATD disable signal 86 and includes disable capability not found in prior TDP generators. TDP generator 94 again produces output signal TDP which gates a pull-down transistor (e.g., an n-channel transistor) 96 to produce the individual ATD signal 34. However, when ATD disable signal 86 is active, output signal TDP is masked, thus preventing pull-down transistor 96 from providing an individual ATD signal 34.

Figure 10:
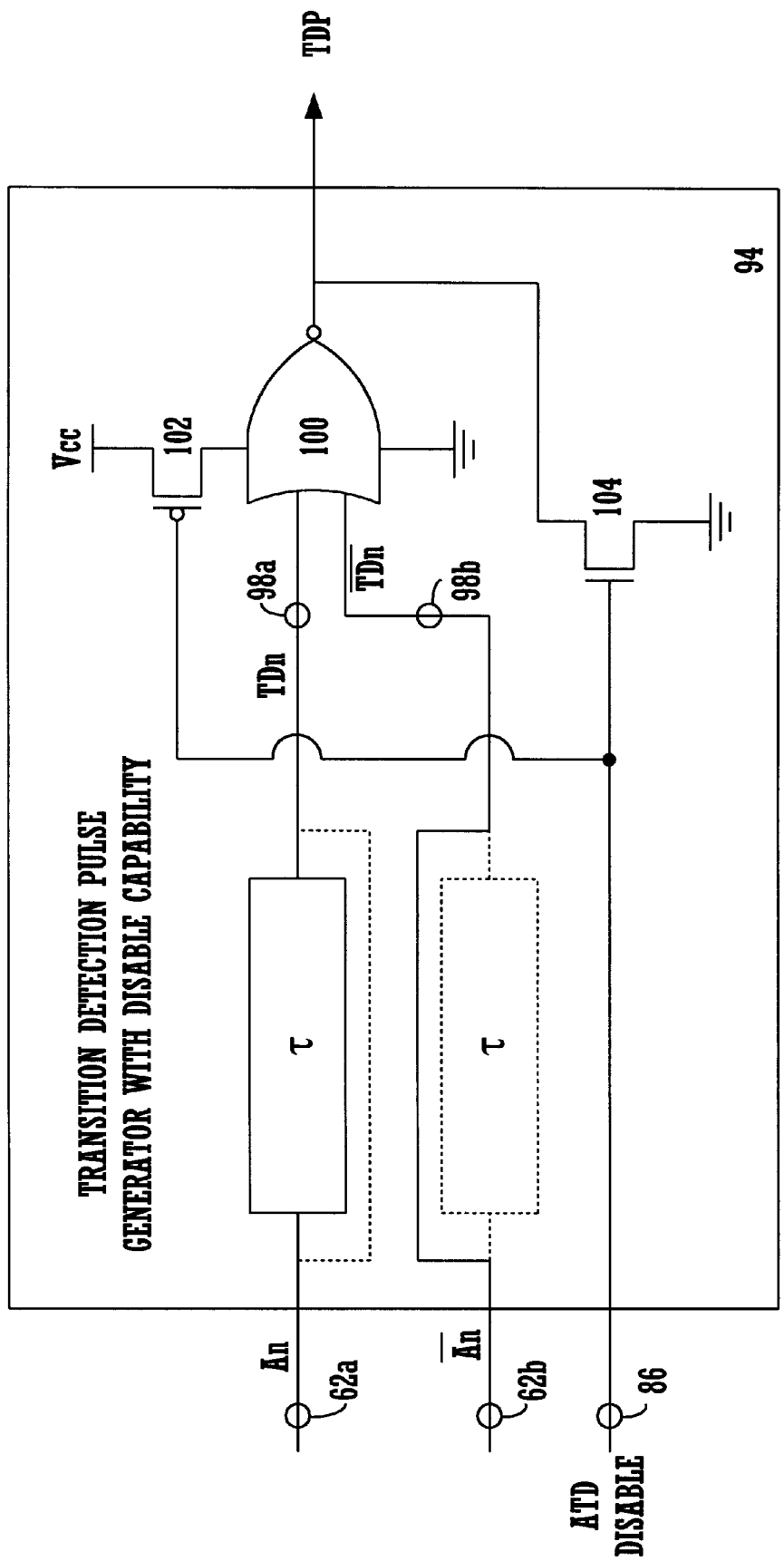
FIG. 10 illustrates a transition detection pulse generator with disable capability for use in the individual ATD signal generator shown in FIG. 9, in accordance with an embodiment of the present invention.

To understand how this function is accomplished, refer to FIG. 10. As shown. TDP generator 94 includes delay blocks τ which may be activated into or out of the true and complement address signal path according to whether the address bit is transitioning from a logic high to logic low or logic low to logic high. The resulting signals are TDn and $\overline{TDn}$, 98a and 98b, respectively. Signals TDn and $\overline{TDn}$, are again provided as inputs to a logic gate 100 (e.g., a NOR gate) which provides signal TDP at its output. Unlike the prior TDP generator 66, however, TDP generator 94 includes disable capability. In the example, this disable capability is provided through the use of transistors 102 and 104. Transistors 102 and 104 are each gated by the ATD disable signal 86 such that when the ATD disable signal 86 is active (e.g., logic high) logic gate 100 is decoupled from its power source (Vcc) and output signal TDP is pulled low. Thus, in this example transistor 102 is a p-channel transistor coupled between the power source and the Vcc power terminal of the logic gate 100, and transistor 104 is an n-channel transistor coupled between the output of logic gate 100 and ground.

Figure 11:
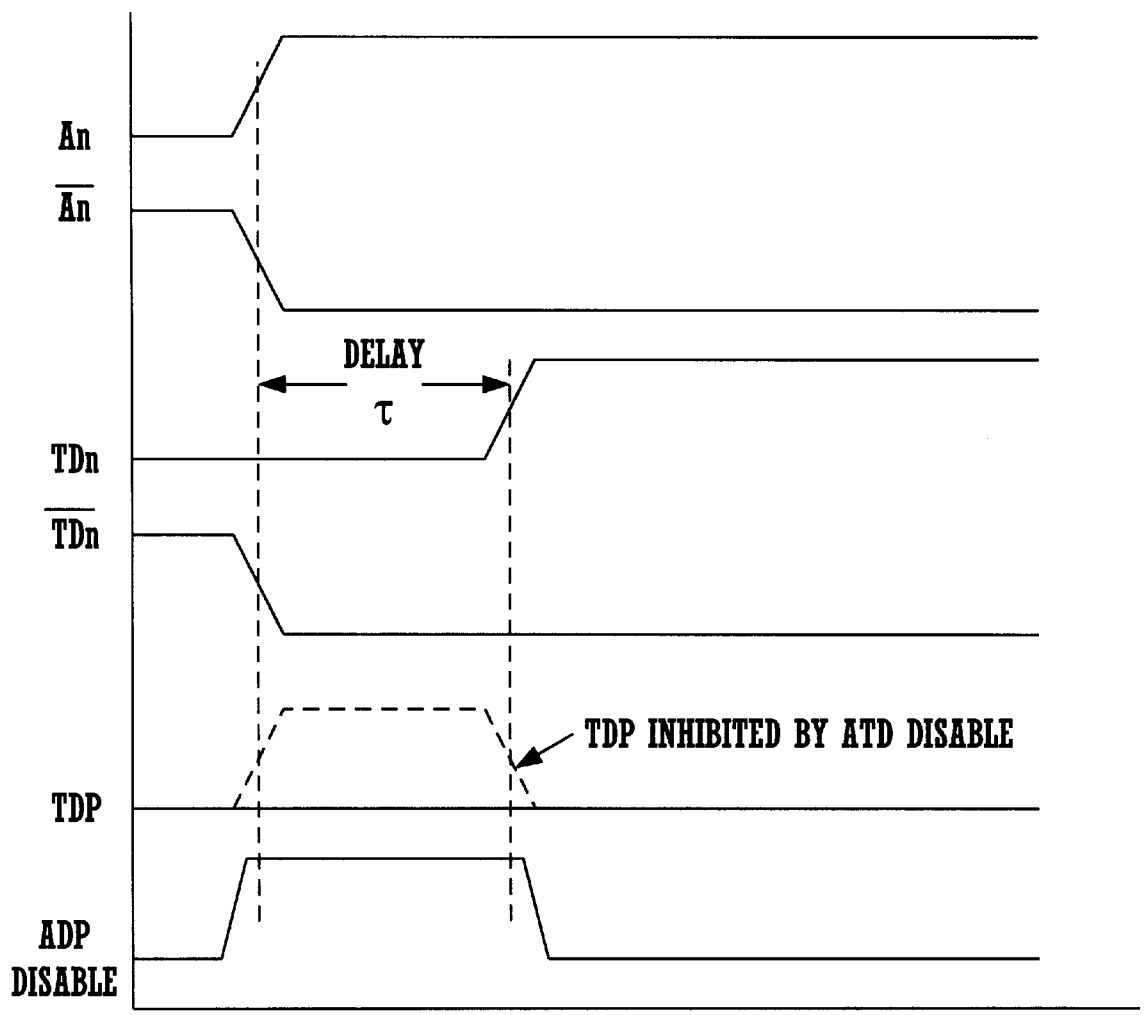
FIG. 11 is a timing diagram for the individual ATD signal generator shown in FIG. 9.

FIG. 11 shows the timing involved with these various signals and components of TDP generator 94. For convenience, the usually small propagation delay through the inactive delay block τ is not explicitly shown. As before, address signals An and $\overline{An}$ transition in response to a change in state of the address input signal 26. Thus, signals TDn and $\overline{TDn}$ follow, with one of these signals being delayed by a time τ. Ordinarily. that is with the TDP generator of the past, this would result in output signal TDP being produced (as shown in dotted outline). However, because of the action of ATD disable signal 86, which starts early enough and is of sufficient width to decouple logic gate 100 from its power source for at least the delay time a, the TDP output signal is masked and remains in a logic low state. Thus, transistor 96 is not switched on at the power-up transition and, as a result, no individual ATD signal 34 is generated. In operation this means that at the power-up time, no global ATD signal 38 will be produced and, as a result, no unnecessary extension of the bit line equalization period will be provided. Thus, Tace will be less than (or in a worst case equal to) Taa, and the timing parameters of memory device 10 are improved.

The present scheme thus ensures that no extra or unnecessary ATD signals are produced at power-up. In addition, the ATD combined circuit 36 will still activate the global ATD signal 38 at power-down, so as to ensure proper bit line equalization during the stand-by mode. Further, the row predecoders disable the wordlines during stand-by. as may also be true in some prior devices (e.g., as shown in dotted outline in FIG. 1). It should be noted that with such a solution, an earlier trailing edge of the ATD combined signal 38 may be experienced, which translates to an earlier sense amp enable. Thus, the sense amp enable timing should be correlated with the duration necessary to develop correct data on the bit lines after the wordline becomes active. That is, the signal developed on the bit lines when the sense amps are enabled should be similar for both Taa and Tace. An example of a possible mechanism for adjusting this timing is the delay circuit 52 in the chip enable input path driving the ATD combined block 36 as shown in FIG. 1.

Figure 12:
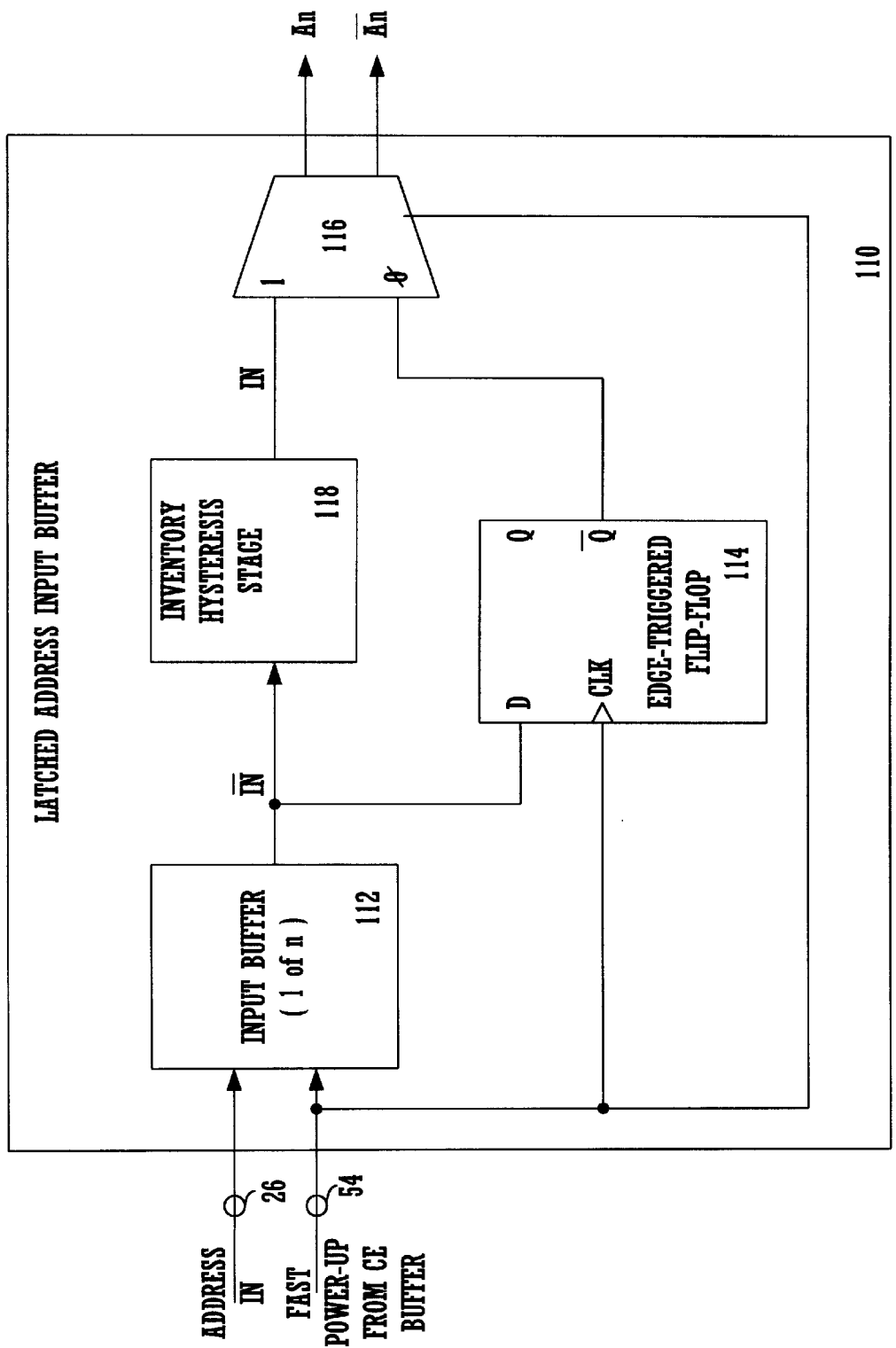
FIG. 12 illustrates an embodiment of an address input buffer for use in a memory device in accordance with yet another embodiment of the present invention.

In some cases, it may be impossible to ensure that power-down results in a global ATD signal 38 being developed to ensure proper equalization. Or, in other cases the row predecoders 30 of the memory device may not be provided with the capability of deactivating the wordlines in response to a power-down signal from the chip enable input buffer 46. In such cases, the above solution may be augmented by or replaced with an alternative solution. This same solution may be used in applications where address transitions at the memory device are not allowed to occur in stand-by later than in the vicinity of the power-down transition. Such a solution involves the use of a latched address input buffer 10, as shown in FIG. 12. The latched address input buffer 110 is capable of avoiding unnecessary internal address transitions at power-up, because the state of the address is stored prior to entering the power-down mode. Thus, during standby, rather than outputting a predetermined logic value the latched address input buffer 110 provides the true address value strobed a short time interval (e.g., as given by the propagation delay time between the chip enable input pin and the chip enable input buffer 46 output signal 54) after the stand-by command time instant. The fact that the logic value of the input is stored in such a way is important because this will reduce the probability of an undesired extended global ATD pulse 38 being produced. This happens, of course, because the true address value is stored and output by the latched address input buffers, rather than some predetermined address value, and thus there will be no input buffer output transition at power-up.

Figure 13:
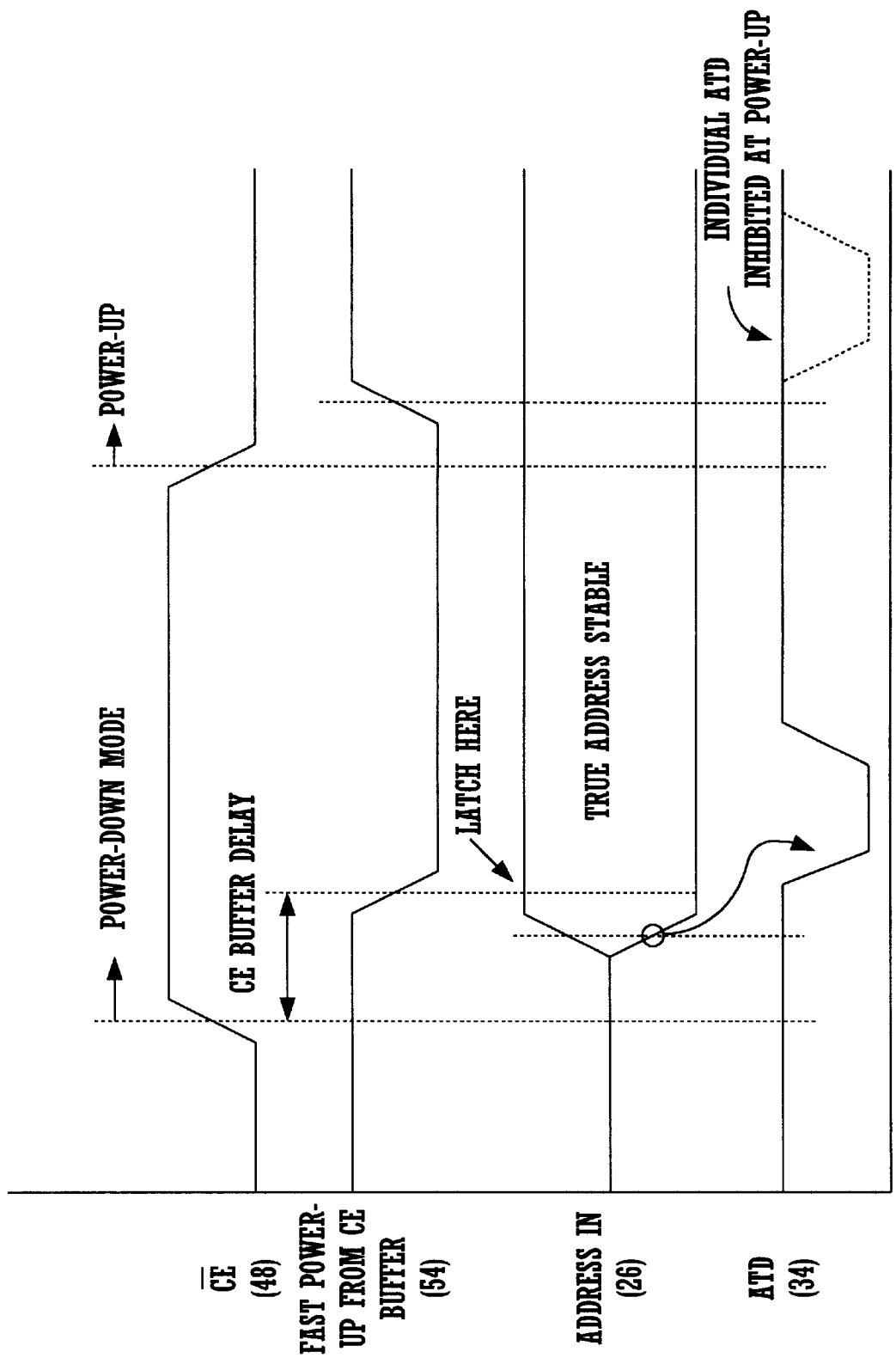
FIG. 13 is a timing diagram for the address input buffer shown in FIG. 12.

Latched address input buffer 110 includes an input buffer 112 which receives the address input signal 26 and the power-up signal 54 from the chip enable input buffer 46. The power-up signal 54 is also provided as the clock input for a storage device 114, which in this example is an edge-triggered D-type flip-flop. The triggering edge is actually the power-down transition of the fast power-up signal 54. Also, the fast power-up signal 54 is used as a select input for a multiplexer 116. In operation, as shown in FIG. 13, an active low chip enable signal 48 transition from a logic low to logic high indicates that the power-down mode is to be entered. This results in the power-up signal 54 being produced, after some delay associated with the chip enable input buffer 46. In accordance with its designation, as fast power-up signal 54, the power-up transition delay is drawn smaller than the power-down transition delay. If, during the time between the $\overline{CE}$ input 48 power-down transition and the associated logic transition of the power-up signal 54 the logic value of the address input 26 is switched, the new address will still be latched in the storage device 114. Then, during power-down as well as after power-up, this will be the output signal of multiplexer 116, if the logic value of the address input signal 26 does not change again. Latched address input buffer 110 may also include an inverting hysteresis stage 118, as is customary in the art.

Figure 14:
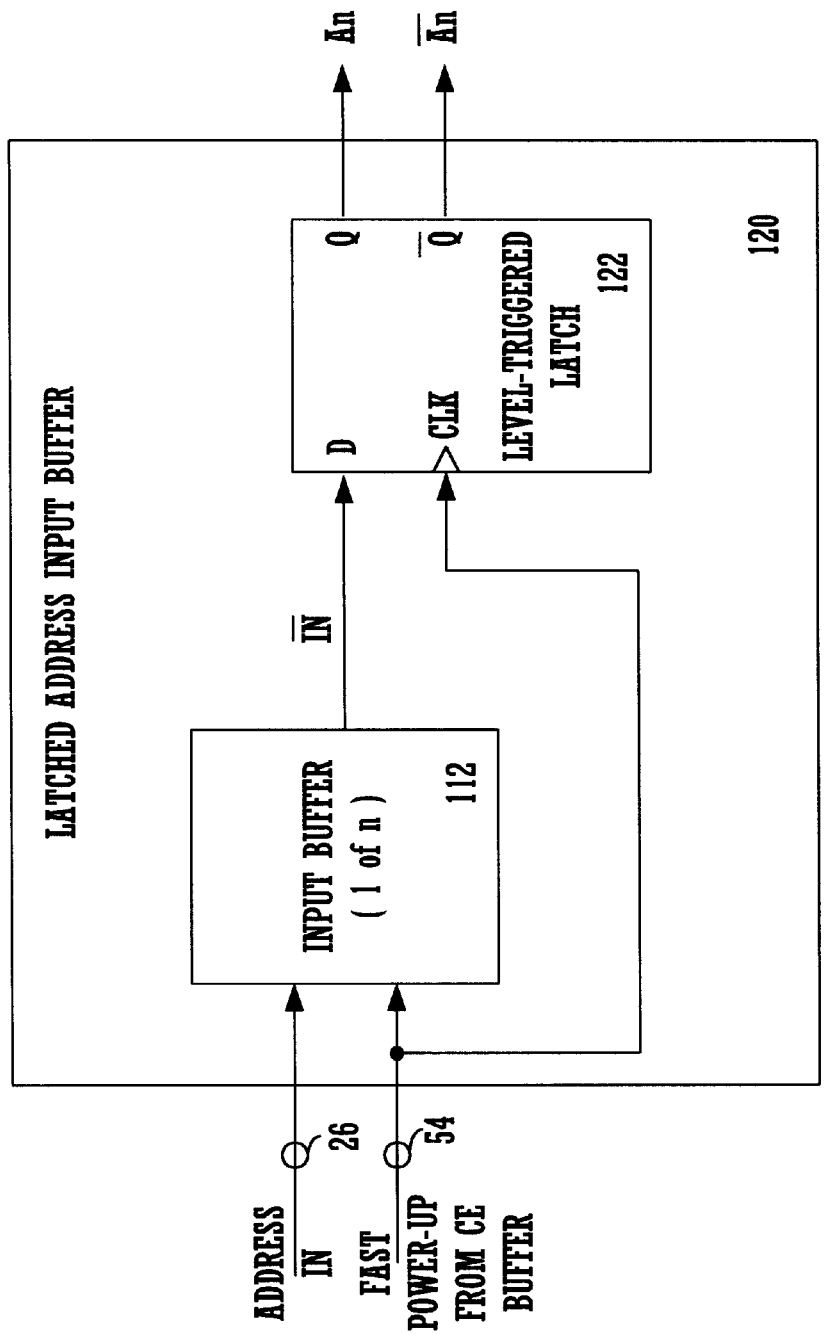
FIG. 14 illustrates an alternative embodiment for an address input buffer for use in a memory device in accordance with still a further embodiment of the present invention.
Figure 15:
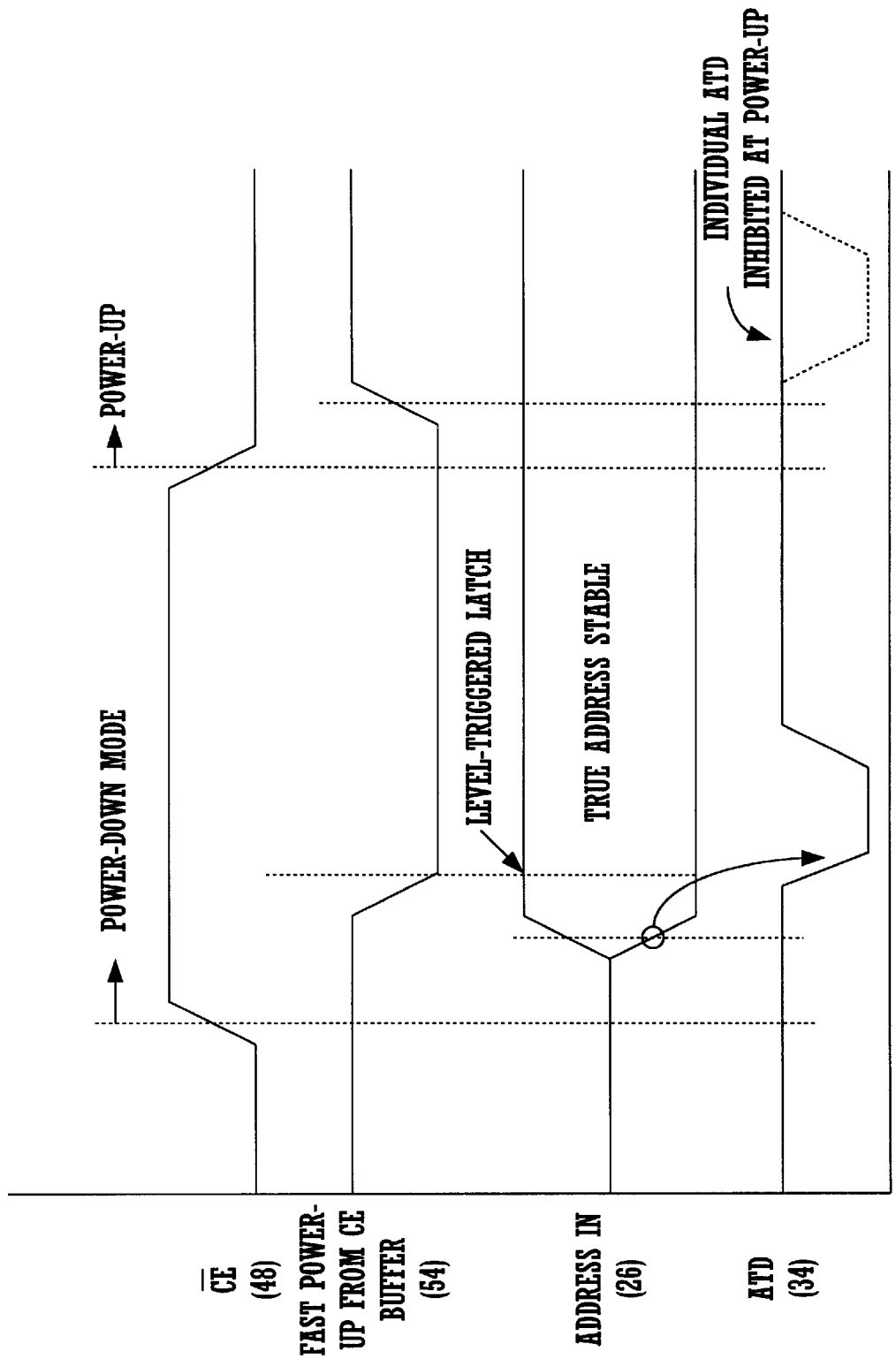
FIG. 15 is a timing diagram for the address input buffer shown in FIG. 14.

A simplified implementation of the latched address input buffer scheme could be used by targeting only the functionality of the circuit illustrated in FIG. 12. Such a latched address input buffer 120 is illustrated in FIG. 14. It should be apparent that a level-triggered latch 122 which is clocked by the power-down transition of power-up signal 54 may be used to capture the address input 26 in the vicinity of a $\overline{CE}$ input 48 power-down transition. For example, as shown in timing diagram of FIG. 15, when the $\overline{CE}$ signal 48 transitions to indicate a power-down mode, the propagation delay time between the chip enable signal and the power-up signal 54 provides an opportunity to still capture the new logic state of the address input 26, in spite of its switching. Thus, the true address value is captured in storage device 122, and there will be no individual ATD signal generated at power-up.

Figure 16:
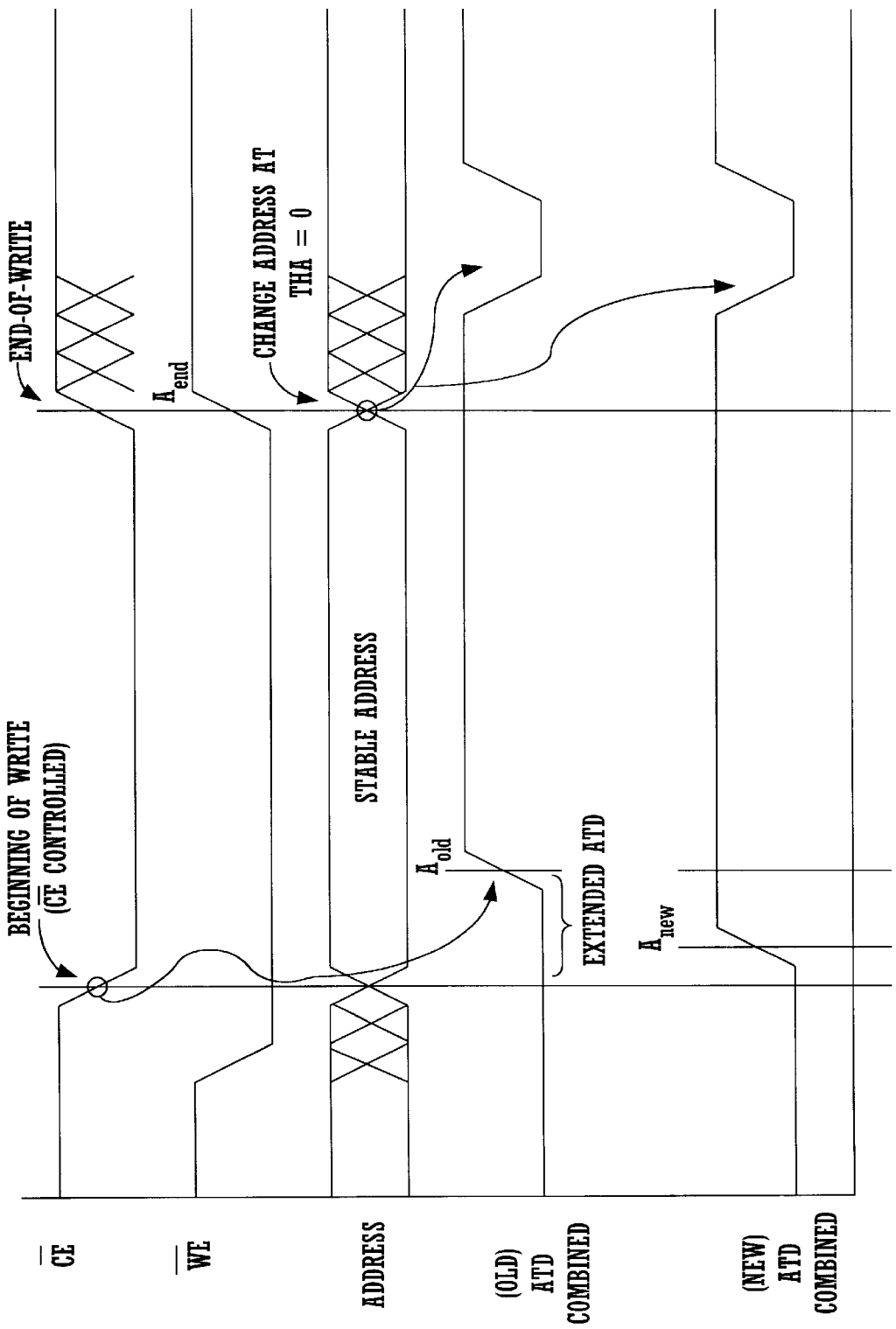
FIG. 16 illustrates the improvement in Tsce that may be experienced as a result of inhibiting an ATD pulse at power-up in accordance with an embodiment of the present invention.

It should also be noted that by using the ATD-inhibit solutions discussed above not only is Tace improved, but Tsce (i.e., a chip enable controlled write access timing parameter defining a period from $\overline{CE}$ going low to the end of the write) benefits as well. for memory devices that used ATD-gated bit line access (such as memory device 10 illustrated in FIG. 1). The relative improvement is shown in FIG. 16 and has to do with the time interval an internal write has available to access the bit lines. In the past, the access time interval began at a time instant $A_{old}$, when the ATD combined signal (i.e., the global ATD signal, extended as a result of the delay through the $\overline{CE}$ buffer, and the subsequent individual ATDs, triggered by the addresses having the true value opposite to the power-down predetermined state) transitioned to a logic high (inactive state). The access time ended at a time instant $A_{end}$, when (in the worst case) the address was switched simultaneously with the end of the write (THA=0). This presented an inherent drawback in that Tsce had to have a larger value than the Tpwe specification (the $\overline{WE}$ pulse width).

The proposed solutions now allow the write to access the bit lines earlier, at time $A_{new}$, because the ATD that would otherwise have occurred as a result of the chip enable signal becoming active is inhibited. This provides an extended period of time for the write to be completed. Thus, Tsce is reduced, eliminating the need to have a larger Tsce (as compared to Tpwe) write parameter specification.

Thus, a scheme for inhibiting ATD signals at power-up in a memory device having a stand-by mode has been presented. As indicated at the outset of this description, although the scheme was illustrated by way of example through the use of the accompanying figures, the broader spirit and scope of the invention should only be measured in terms of the claims which follow.

What is claimed is:

1. A method, comprising: detecting a power-up transition at a memory device having a power-down mode; and inhibiting, in response to the power-up transition, an address transition detection (ATD) signal within the memory device provided a power-down transition which preceded the power-up transition ensured bitline equalization within the memory device.

2. The method of claim 1, wherein the wordlines of the memory device are disabled during the power-down mode.

3. The method of claim 2, wherein the wordlines of the memory device are enabled in response to the power-up transition.

4. The method of claim 3, wherein the wordlines of the memory device arc enabled after a delay matched to an address path delay to ensure a valid address is available for a first access following power-down.

5. The method of claim 1, wherein inhibiting the ATD signal comprises generating a pulse having an appropriate starting time, and of sufficient duration to decouple all ATD pulse generator from dynamic bitline equalization control circuitry within the memory device.

6. The method of claim 5, wherein the pulse is generated by combining at least two signals produced in response to the power-up transition, at least one of the two signals being delayed in time with respect to the other of the two signals.

7. The method of claim 6, wherein the combining of the at least two signals is accomplished in a logical NOR fashion.

8. A method, comprising:

disabling, during a power-down mode, one or more wordlines of a memory device; and in response to a power-up transition, enabling the wordlines after a delay matched to an address path delay to ensure a valid address is available for a first access following power-down and inhibiting an address transition detection (ATD) signal within the memory device.

9. A method, comprising:

disabling, during a power-down mode, one or more wordlines of a memory device; and in response to a power-up transition, enabling the wordlines and inhibiting an address transition detection (ATD) signal within the memory device by decoupling an ATD signal generator from dynamic bitline equalization control circuitry within the memory device.

10. The method of claim 9, wherein decoupling the ATD signal generator comprises removing power from a logic gate within the ATD signal generator.

11. The method of claim 10, wherein removing power from the logic gate comprises providing a pulse having an appropriate starting time and of sufficient duration to mask the ATD signal, to gate a transistor coupled between a power source and the logic gate.

12. A method, comprising preventing an address transition detection (ATD) signal from being, produced within memory device at a power-up transition from a power-down mode by latching an address at the memory device following an indication that the memory device is about to enter the power-down mode.

13. The method of claim 12, wherein latching the address is performed in response to a power-down signal provided within the memory device after a delay sufficient to ensure a stable address will be available.

14. A memory device, comprising:

a first circuit coupled to receive an indication of a power-up transition from a power-down mode and configured to inhibit an address transition detection (ATD) signal within the memory device at at the power-up transition from the power-down mode; and a second circuit coupled to receive the indication of the power-up transition from the power-down mode and configured to enable one or more wordlines of the memory device in response to the power-up transition.

15. The memory device of claim 14, wherein the first circuit comprises a pulse generator.

16. The memory device of claim 15, wherein the pulse generator is configured to combine a pair of signals produced in response to the power-up transition, one of the pair of signals being time-delayed with respect to the other.

17. The memory device of claim 16, wherein the pulse generator includes a logical NOR gate coupled to receive the pair of signals as inputs and to provide an output signal having an appropriate starting time, and of sufficient duration to inhibit the ATD signal.

18. The memory device of claim 17, wherein the output signal of the NOR gate is provided to a third circuit configured to decouple the ATD signal from dynamic bitline equalization control circuitry within the memory device.

19. The memory device of claim 18, wherein the third circuit includes a logic gate coupled to receive an address signal and to produce the ATD signal in response thereto, the logic gate having a power source and the output signal of the NOR gate being coupled so as to decouple the logic gate from the power source in response to the power-up transition.

20. The memory device of claim 19, wherein the logic gate is coupled to the power source through a transistor gated by the output signal of the NOR gate.

21. The memory device of claim 14, wherein the first circuit comprises an address buffer configured to store an address input thereto in response to an indication that the memory device is about to enter the power-down mode.

22. The memory device of claim 21, wherein the address buffer comprises a level-triggered latch coupled to receive a delayed version of a power-down signal.

23. The memory device of claim 21, wherein the address buffer comprises an edge-triggered storage device coupled to receive a delayed version of a power-down signal.

24. A method, comprising:

generating, within a memory device having a power-down mode and in response to a power-down transition, a first address transition detection (ATD) signal of sufficient duration to ensure perfect bitline equaliztion within the memory device;

inhibiting, in response to a power-up transition following the power-down transition, a second ATD signal; and enabling wordlines within the memory device only after a stable address is available following the power-up transition.

25. The method of claim 24, wherein inhibiting the ATD signal comprises generating a pulse having an appropriate starting time, and of sufficient duration to decouple an ATD pulse generator from dynamic bitline equalization control circuitry within the memory device.

26. The method of claim 25, wherein the pulse is generated by combining at least two signals produced in response to the power-up transition, at least one of the two signals being delayed in time with respect to the other of the two signals.

27. The method of claim 26, wherein the combining of the at least two signals is accomplished in a logical NOR fashion.

* * * * *